United States Patent
Kim

(10) Patent No.: US 7,736,974 B2
(45) Date of Patent: Jun. 15, 2010

(54) METHOD FOR MANUFACTURING SEMICONDUCTOR DEVICE TO PREVENT DEFECTS DUE TO INSULATION LAYER VOLUME CHANGE

(75) Inventor: Jun Ki Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 20 days.

(21) Appl. No.: 12/100,492

(22) Filed: Apr. 10, 2008

(65) Prior Publication Data
US 2009/0124094 A1   May 14, 2009

(30) Foreign Application Priority Data
Nov. 9, 2007   (KR) .................. 10-2007-0114269

(51) Int. Cl.
*H01L 21/336* (2006.01)
(52) U.S. Cl. ..................................... 438/259
(58) Field of Classification Search ............. None
See application file for complete search history.

(56) References Cited
U.S. PATENT DOCUMENTS
2004/0235285 A1* 11/2004 Kang et al. ............. 438/597
2005/0277254 A1* 12/2005 Ha et al. ................. 438/259
2007/0026621 A1*  2/2007 Cho et al. ............... 438/314

FOREIGN PATENT DOCUMENTS
| JP | 63-111648 A | 5/1988 |
| KR | 1020050056364 A | 6/2005 |
| KR | 1020060057163 A | 5/2006 |
| KR | 1020060104829 A | 10/2006 |

* cited by examiner

*Primary Examiner*—Charles D Garber
*Assistant Examiner*—Andre' C Stevenson
(74) *Attorney, Agent, or Firm*—Ladas & Parry LLP

(57) ABSTRACT

A semiconductor device is made by forming patterns on a semiconductor substrate. After forming the patterns, sequentially forming a spacer layer, an oxidation promotion layer and a buffer layer on the semiconductor substrate including the surfaces of the patterns previously formed. An insulation layer is then formed on the buffer layer to fill the patterns. The semiconductor substrate including the insulation layer is subsequently annealed such that the buffer layer is oxidized and the insulation layer is baked.

18 Claims, 7 Drawing Sheets

METHOD FOR MANUFACTURING SEMICONDUCTOR DEVICE TO PREVENT DEFECTS DUE TO INSULATION LAYER VOLUME CHANGE

CROSS-REFERENCE TO RELATED APPLICATIONS

The present application claims priority to Korean patent application number 10-2007-0114269 filed on Nov. 9, 2007, which is incorporated herein by reference in its entirety.

BACKGROUND OF THE INVENTION

The present invention relates to a method for manufacturing a semiconductor device, and more particularly, to a method for manufacturing a semiconductor device which can minimize the occurrence of defects due to a change in the volume of an insulation layer.

In a memory device such as DRAM (dynamic random access memory), bit lines are formed to supply current to junction areas to allow a charge to be stored in capacitors and to transmit a difference in amount of charge between capacitors to sense amplifiers to thereby allow the charge stored in the capacitors to be used as data.

Meanwhile, as semiconductor devices become more highly integrated, the size of a contact hole, which serves as an electrical connection path between top and bottom conductors, gradually decreases. In this situation, a method for forming storage node contacts between the bit lines has been disclosed in the art.

Hereafter, a conventional method for manufacturing a semiconductor device, including processes for forming bit lines and storage node contacts, will be schematically explained.

A conductive layer for bit lines is formed on a semiconductor substrate. A hard mask layer is then formed on the conductive layer for bit lines. The bit lines are formed by sequentially etching the hard mask layer and the conductive layer for bit lines. The conductive layer for bit lines comprises a metal layer and the hard mask layer preferably comprises a nitride layer.

A spacer layer comprising a nitride layer is formed on the resultant semiconductor substrate including the bit lines. The spacer layer is formed to prevent the bit lines and storage node contacts, which are subsequently formed, from being short-circuited.

An insulation layer is deposited on the spacer layer to fill spaces defined between the bit lines. Preferably, the insulation layer is deposited as an HDP (high density plasma) layer or as an SOD (spin-on dielectric) layer. A mask pattern is then formed on the insulation layer to expose storage node contact forming regions between the bit lines. Storage node contact holes are defined by etching the insulation layer using the mask pattern as an etch mask. Storage node contacts are formed by filling a polysilicon layer in the storage node contact holes.

The manufacture of a semiconductor device is completed by sequentially conducting a series of subsequent well-known processes.

However, in the conventional method described above, stress is likely to occur in the bit lines in a subsequent process due to a change in the volume of the insulation layer or due to a difference in thermal expansion coefficients of the insulation layer and the bit lines. In particular, the stress occurs unevenly on both sides of each bit line causing the bit line to lean or collapse.

For example, when the insulation is deposited as an HDP layer, stress is occurs unevenly on both sides of each bit line because the thickness of the insulation layer deposited on the sidewalls of the bit line changes largely depending upon the volume of the space between the bit lines. Accordingly, the bit line leans or collapses. When the insulation layer is deposited as an SOD layer, a volume change largely occurs when conducting an annealing process to bake the SOD layer. Accordingly, stress once again occurs unevenly both sides of each bit line and the leaning or collapsing of the bit line occurs.

Specifically, where leaning or collapsing of the bit lines occurs, when defining the storage node contact holes, the storage node contact holes may not be properly defined on a side opposite to the direction in which the bit lines lean or collapse, or the storage node contacts and the bit lines are likely to come into contact with each other and bridges are likely to be formed in the direction in which the bit lines lean or collapse. Consequently, the reliability of the semiconductor device can be degraded and the manufacturing yield can decrease.

In order to reduce the change in the volume of the insulation layer, such as an SOD layer, a method has been suggested in the art. The method suggests that a silicon layer is formed on the nitride spacer layer formed on the bit lines. In this method, the decrease in the volume of the insulation layer can be partially compensated for since the silicon layer is oxidized and increases in volume when annealing the SOD layer.

Nevertheless, utilizing this method, as design rules for semiconductor devices decrease, it is difficult to secure a silicon layer thickness thick enough to compensate for the decrease in the is volume of the insulation layer since the silicon layer cannot be formed to have a thickness greater than 30~50 Å. As a result, the change in the insulation layer volume cannot be properly reduced.

SUMMARY OF THE INVENTION

Embodiments of the present invention are directed to a method for manufacturing a semiconductor device which can minimize the occurrence of defects due to a change in the volume of an insulation layer.

Embodiments of the present invention are also directed to a method for manufacturing a semiconductor device which can improve the characteristics of a semiconductor device and increase the manufacturing yield.

In one embodiment, a method for manufacturing a semiconductor device comprises the steps of forming patterns on a semiconductor substrate; forming a spacer layer, an oxidation promotion layer and a buffer layer on the semiconductor substrate including surfaces of the patterns; forming an insulation layer on the buffer layer to fill the patterns; and annealing the semiconductor substrate formed with the insulation layer such that the buffer layer is oxidized and the insulation layer is baked.

The patterns are any ones of trenches, word lines and bit lines.

The spacer layer comprises a nitride layer.

The spacer layer is formed to a thickness of 100~100 Å.

The oxidation promotion layer comprises an oxide layer and is formed to a thickness of 10~150 Å.

The buffer layer comprises an Si layer or a Ge layer and is formed to a thickness of 10~100 Å.

After the buffer layer is deposited, portions of the buffer layer, which are formed on the upper surfaces of the patterns, are etched to have a smaller thickness on the upper surfaces of the patterns than on the sidewalls of the patterns.

The buffer layer is formed to have a thickness on the upper surfaces of the patterns, which is less by 10~100 Å than a thickness on the sidewalls of the patterns.

After the step of forming the spacer layer, the oxidation promotion layer and the buffer layer and before the step of forming the insulation layer, the method further comprises the step of selectively removing partially or wholly the buffer layer formed on the upper surfaces of the patterns.

The insulation layer comprises an SOD layer or an $O_3$-USG layer.

In another embodiment, a method for manufacturing a semiconductor device comprises the steps of forming patterns on a semiconductor substrate; forming a spacer layer and a buffer layer comprising any one of an Si-rich oxide layer and a Ge-rich oxide layer, on the semiconductor substrate including surfaces of the patterns; forming an insulation layer on the buffer layer to fill the patterns; and annealing the semiconductor substrate formed with the insulation layer such that the buffer layer is oxidized and the insulation layer is baked.

The patterns are any ones of trenches, word lines and bit lines.

The buffer layer comprises an $SiO_x$ layer ($0.5 \leq x \leq 1.7$) or a $GeO_x$ layer ($0.5 \leq x \leq 1.7$).

The buffer layer is formed to a thickness of 50~200 Å.

The insulation layer comprises an SOD layer or an $O_3$-USG layer.

DESCRIPTION OF SPECIFIC EMBODIMENTS

In the present invention, a buffer layer is formed over a nitride spacer layer with an oxide layer interposed therebetween, or a buffer layer comprising an Si-rich oxide layer is formed over a nitride spacer layer. Accordingly, even though the volume of an insulation layer decreases due to a subsequent annealing process for baking the insulation layer, the change in volume of the insulation layer can be compensated for since the buffer layer is oxidized and increases in volume.

Accordingly, in the present invention, the occurrence of defects due to the change in volume of the insulation layer can be suppressed or minimized, whereby the characteristics of a semiconductor device can be improved and the manufacturing yield can be increased.

Hereafter, specific embodiments of the present invention will be described in detail with reference to the attached drawings.

FIGS. 1A through 1G are sectional views illustrating the processes of a method for manufacturing a semiconductor device in accordance with an embodiment of the present invention.

Figure 1A:
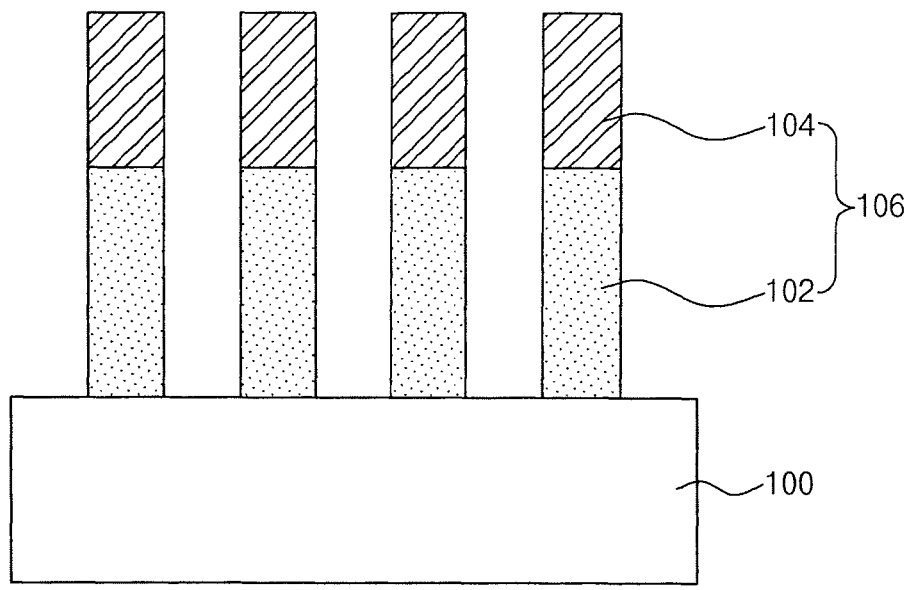
FIGS. 1A through 1G are sectional views illustrating the processes of a method for manufacturing a semiconductor device in accordance with an embodiment of the present invention.

Referring to FIG. 1A, a conductive layer 102 for bit lines and a hard mask layer 104 are sequentially formed on a semiconductor substrate 100 which has a predefined lower structure (not shown) including a device isolation layer and gates. A plurality of bit lines 106 are formed spaced apart from one another by etching the hard mask layer 104 and the conductive layer 102 for bit lines.

Figure 1B:
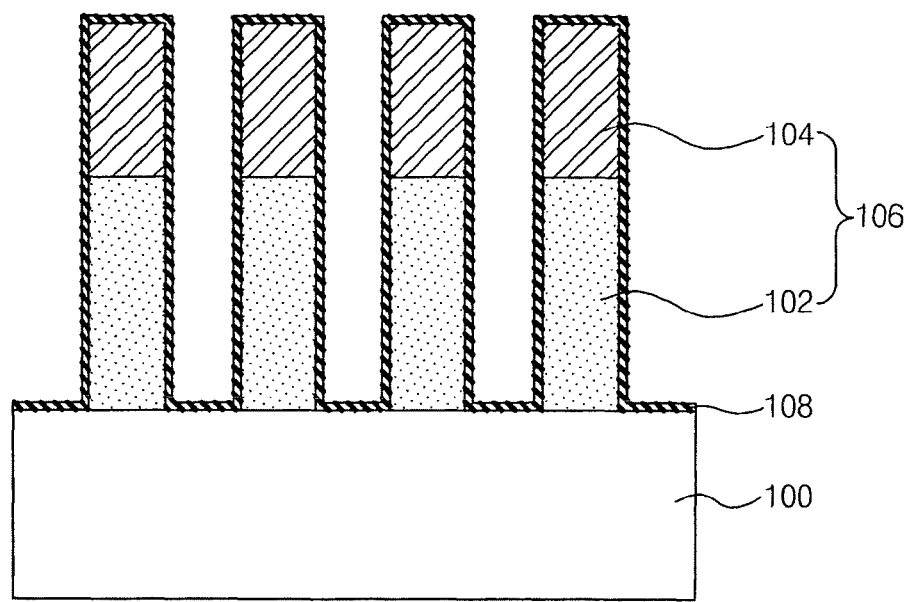

Referring to FIG. 1B, a nitride layer 108 for a spacer is formed on the semiconductor substrate 100 including the bit lines 106. The nitride layer 108 for a spacer is formed to prevent the bit lines 106 and storage node contact plugs to be subsequently formed from becoming short-circuited. Preferably, the nitride layer 108 for a spacer is formed to have a thickness of 10~100 Å.

In a subsequent process, an insulation layer comprising an oxide layer is deposited to cover the bit lines 106, and storage node contact plug holes are defined by etching the portions of the insulation layer which are formed in the spaces between the bit lines 106. The possibility of the bit lines 106 to be exposed and contact the storage node contact plugs formed in the storage node contact plug holes can be decreased even though a misalignment may occur when conducting the etching since the nitride layer 108 for a spacer is not etched in comparison with the insulation layer.

Figure 1C:
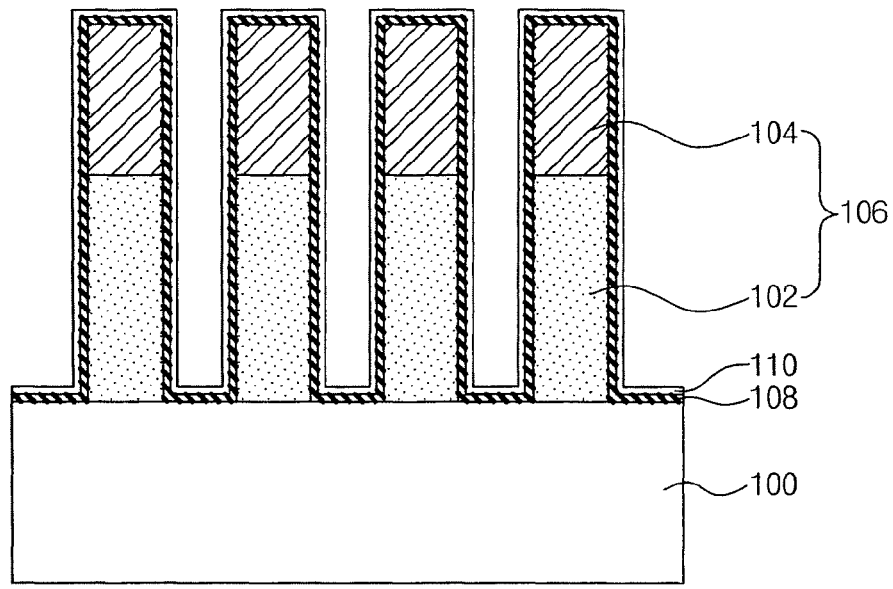

Referring to FIG. 1C, an oxide layer 110 is formed as an oxidation promotion layer on the nitride layer 108 formed on the bit lines 106. The oxide layer 110, when preferably formed to have a thickness of 10~150 Å, promotes the oxidation of a subsequently formed buffer layer when an annealing process is performed.

Figure 1D:
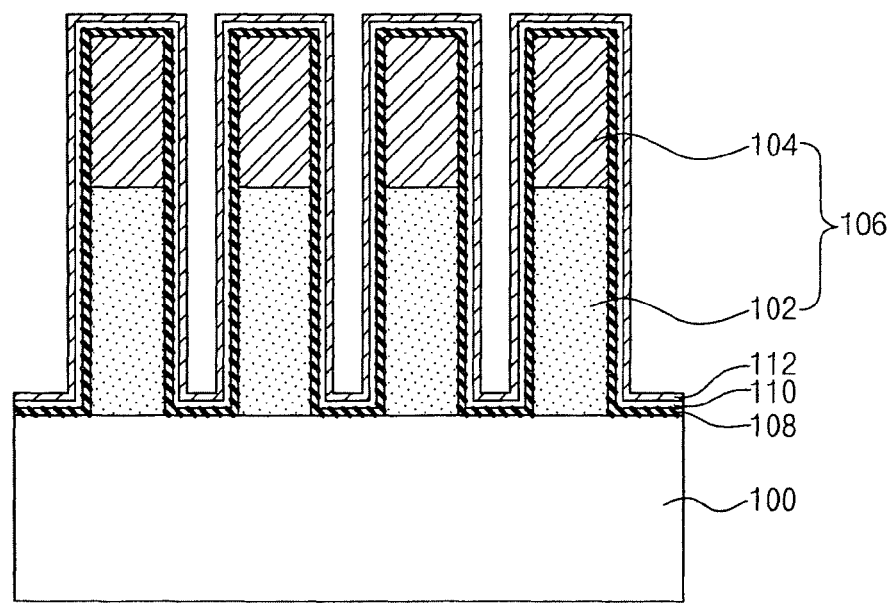

Referring to FIG. 1D, a silicon layer 112 is formed as a buffer layer on the oxide layer 110 over the bit lines 106. The silicon layer 112, when preferably formed to have a thickness of 10~100 Å, serves as a buffer layer which is oxidized and compensates for the decrease in the volume of an insulation layer when an annealing process is subsequently performed. The buffer layer may be formed of a germanium (Ge) layer in place of the silicon layer.

Figure 1E:
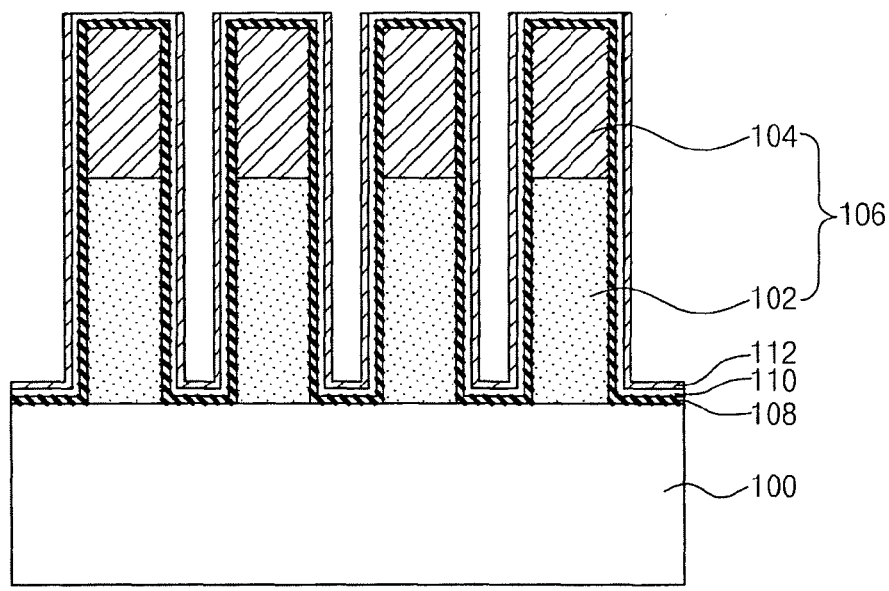

Referring to FIG. 1E, portions of the silicon layer 112 formed on the upper surfaces of the bit lines 106 are selectively removed. The portions of the silicon layer 112 are removed via an etch-back process. The portions of the silicon layer 112, which are formed on the upper surfaces of the bit lines 106, can be partially or wholly removed. The reason for partially or wholly removing the portions of the silicon layer 112 formed on the upper surfaces of the bit lines 106 is described in detail below.

The silicon layer 112 is oxidized by the oxygen diffused from the oxide layer 110 as an oxidation promotion layer when subsequently conducting an annealing process. If the annealing process is conducted while the silicon layer 112 is formed having a uniform thickness on both the upper surfaces and the sidewalls of the bit lines 106, the oxidation of the silicon layer 112 cannot occur properly since the oxygen cannot be sufficiently diffused from the oxide layer 110. Therefore, it is preferred that the silicon layer 112 be formed to have a smaller thickness on the upper surfaces of the bit lines 106 than on the sidewalls of the bit lines 106. For instance, it is preferred that the thickness of the silicon layer 112 on the upper surfaces of the bit lines 106 be 10~100 Å less than the thickness of the silicon layer 112 on the sidewalls of the bit lines 106. As a result, the portions of the silicon layer 112 formed on the upper surfaces of the bit lines 106 are partially or wholly etched.

Figure 1F:
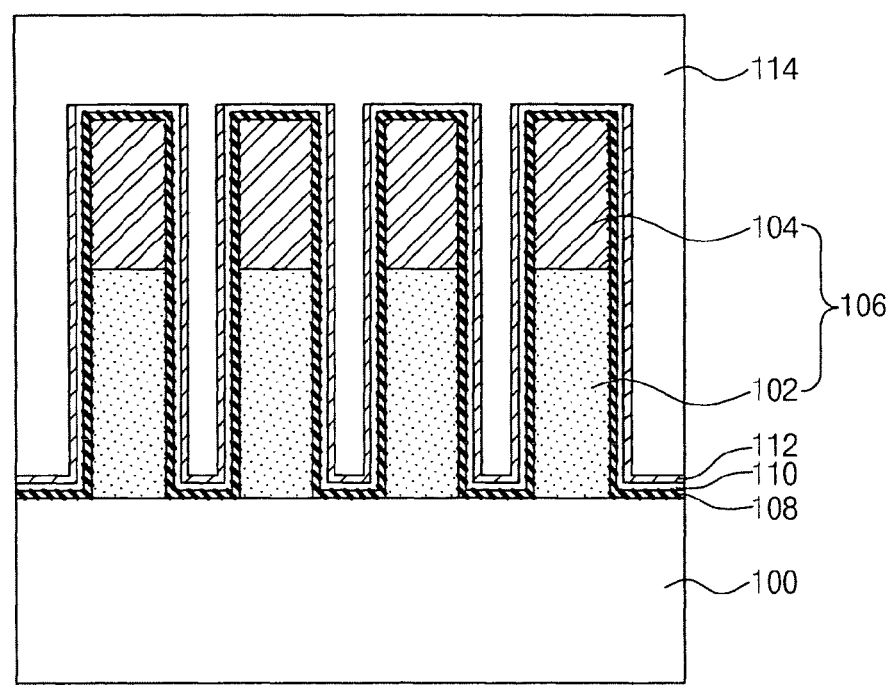

Referring to FIG. 1F, an insulation layer 114 is formed on the resultant semiconductor substrate 100 to cover the bit lines 106 including the silicon layer 112. The insulation layer 114 is formed as a flowable insulation layer having excellent gap-fill characteristic, for example, such as a SOD (spin-on dielectric) layer or an $O_3$-USG (undoped silicate glass) layer, so that the fine spaces between the bit lines 106 are filled with the insulation layer 114.

Figure 1G:
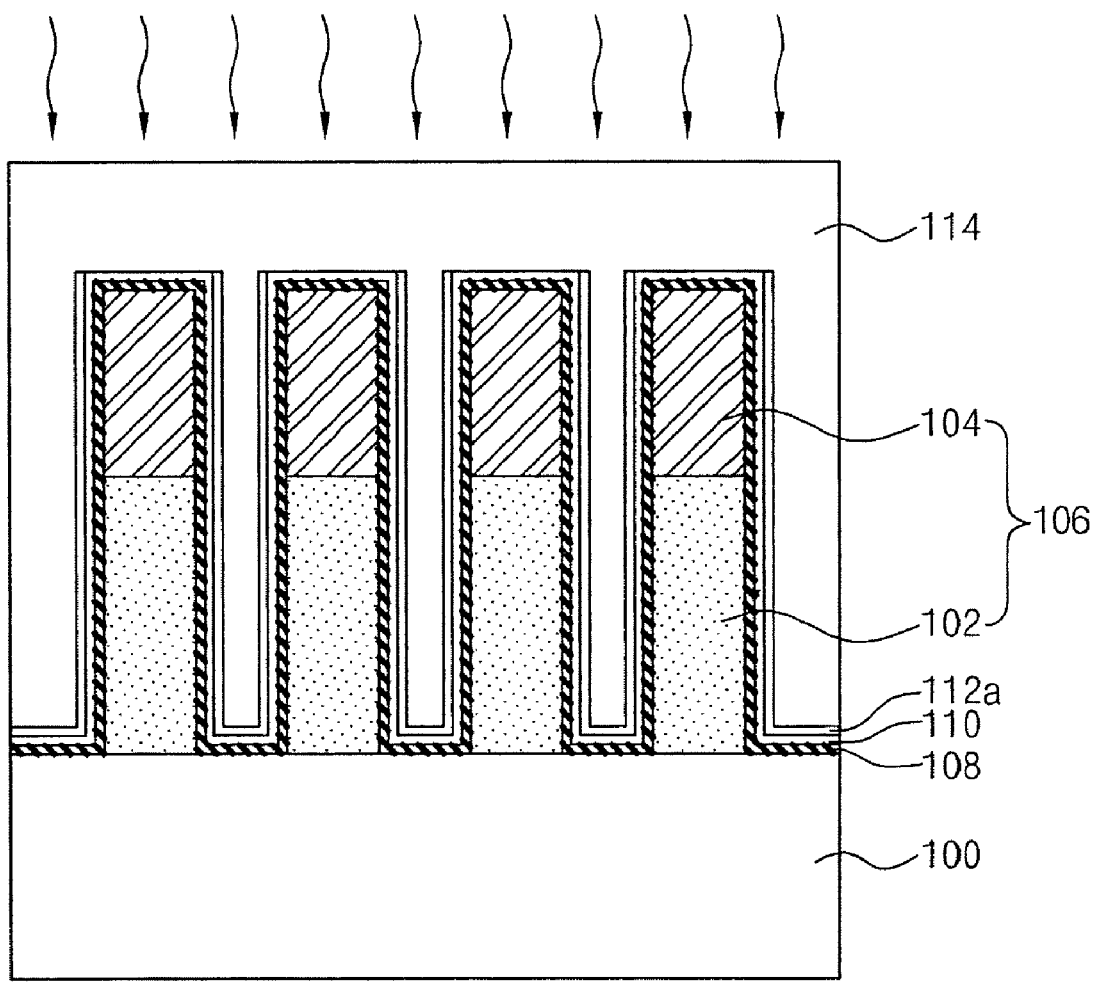

Referring to FIG. 1G, the resultant semiconductor substrate 100, which is formed with the insulation layer 114, is annealed under a wet atmosphere of $H_2O$ and $O_2$ to bake the insulation layer 114 and oxidize the silicon layer 112. Through the annealing process, the volume of the insulation layer 114 decreases, whereas the volume of an oxidized silicon layer 112a increases.

Here, the silicon layer 112 can be oxidized within a short period of time because the oxidation of the silicon layer 112 occurs on both surfaces thereof that contact the insulation layer 114 and the oxide layer 110 as an oxidation promotion layer. For example, oxidation can occur twice as fast as the conventional art. Hence, in an embodiment of the present invention, it is possible to oxidize the silicon layer 112 to a thickness thick enough to compensate for the decrease in volume of the insulation layer 114 without increasing the thickness of the silicon layer 112, by which the change in the volume of the insulation layer 114 can be reduced. Therefore, in an embodiment of the present invention, the leaning or collapsing of the bit lines 106 due to the change in volume of the insulation layer 114 can be suppressed or minimized, whereby the characteristics of the semiconductor device can be improved and the manufacturing yield can be increased.

The manufacture of a semiconductor device according to an embodiment of the present invention is completed by sequentially conducting a series of well-known subsequent processes (not shown).

It was explained in the above-described embodiment of the present invention that the silicon layer is formed on the nitride layer for a spacer with the oxide layer interposed therebetween to compensate for the decrease in volume of the insulation layer, however the same effects can be accomplished by forming an Si-rich oxide layer on the nitride layer for a spacer in accordance with another embodiment of the present invention.

FIGS. 2A through 2E are sectional views illustrating the processes of a method for manufacturing a semiconductor device in accordance with another embodiment of the present invention.

Figure 2A:
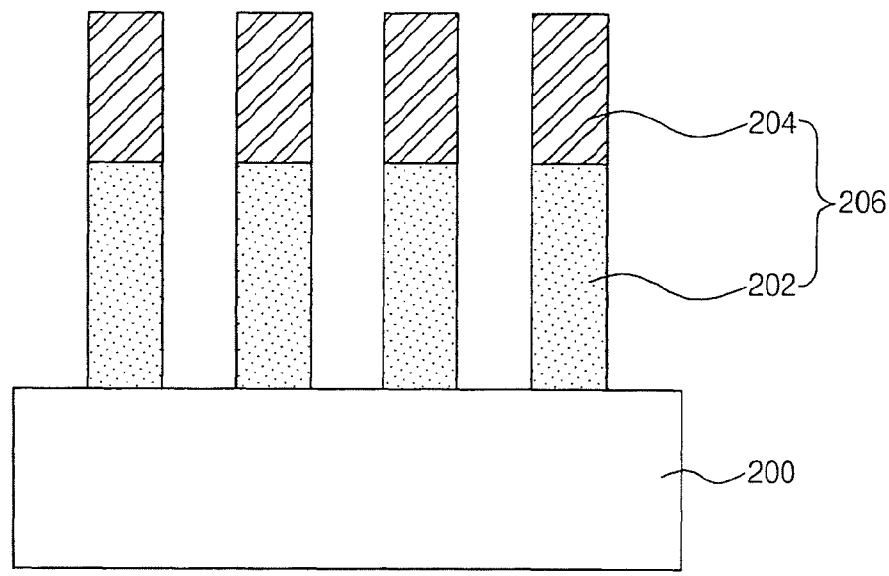
FIGS. 2A through 2E are sectional views illustrating the processes of a method for manufacturing a semiconductor device in accordance with another embodiment of the present invention.

Referring to FIG. 2A, a conductive layer 202 for bit lines and a hard mask layer 204 are sequentially formed on a semiconductor substrate 200 which has a predefined lower structure (not shown) including a device isolation layer and gates. A plurality of bit lines 206 are formed spaced apart from one another by etching the hard mask layer 204 and the conductive layer 202 for bit lines.

Figure 2B:
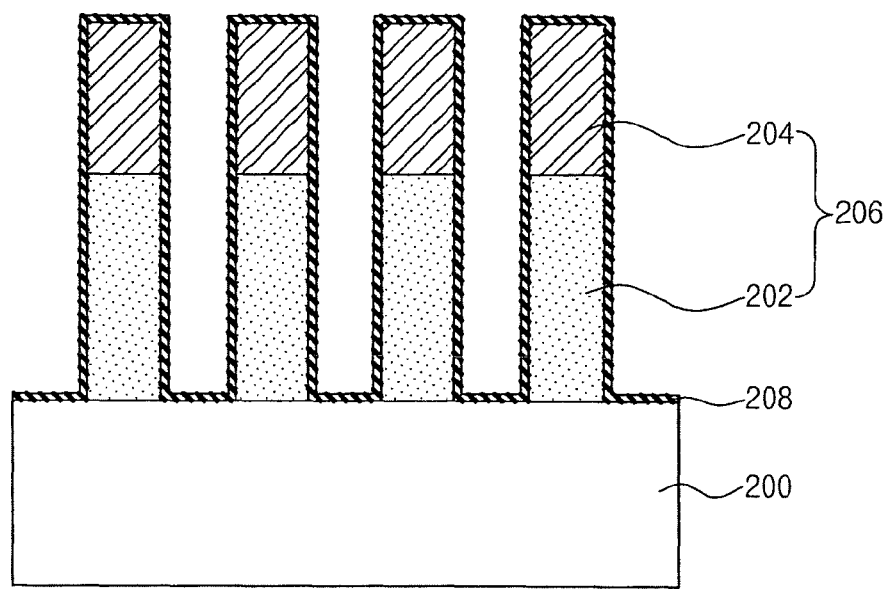

Referring to FIG. 2B, a nitride layer 208 for a spacer is formed on the semiconductor substrate 200 including the bit lines 206. The nitride layer 208 for a spacer is formed to prevent the bit lines 206 and storage node contact plugs to be subsequently formed from becoming short-circuited. Preferably, the nitride layer 208 for a spacer is formed to have a thickness of 10~100 Å.

Figure 2C:
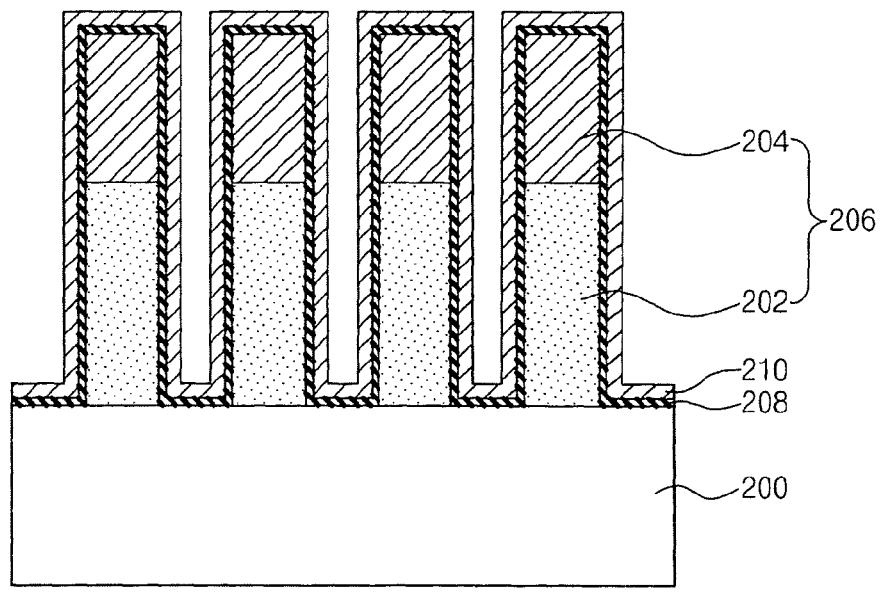

Referring to FIG. 2C, an Si-rich oxide layer 210 is formed on the nitride layer 208 for a spacer formed on the bit lines 206. The Si-rich oxide layer 210, when preferably formed to have a thickness of 50~200 Å, serves as a buffer layer which compensates for the decrease in volume of an insulation layer when subsequently performing an annealing process.

The Si-rich oxide layer 210 is formed, for example, as an $SiO_x$ layer wherein x has a range of 0.5~1.7. In place of the Si-rich oxide layer 210, a Ge-rich oxide layer, for example, a $GeO_x$ layer, can be formed wherein x has a range of 0.5~1.7.

Figure 2D:
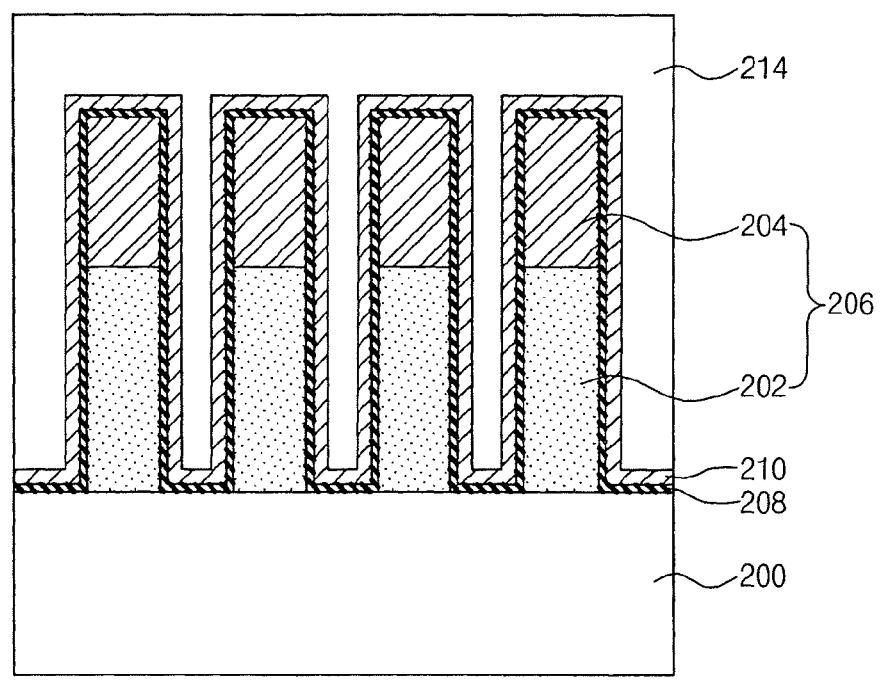

Referring to FIG. 2D, an insulation layer 214 is formed on the resultant substrate 200 to cover the bit lines 206 including the Si-rich oxide layer 210. The insulation layer 214 is formed as a flowable insulation layer having excellent gap-fill characteristic, for example, such as a SOD layer or an $O_3$-USG layer, so that the fine spaces between the bit lines 206 are filled with the insulation layer 214.

Figure 2E:
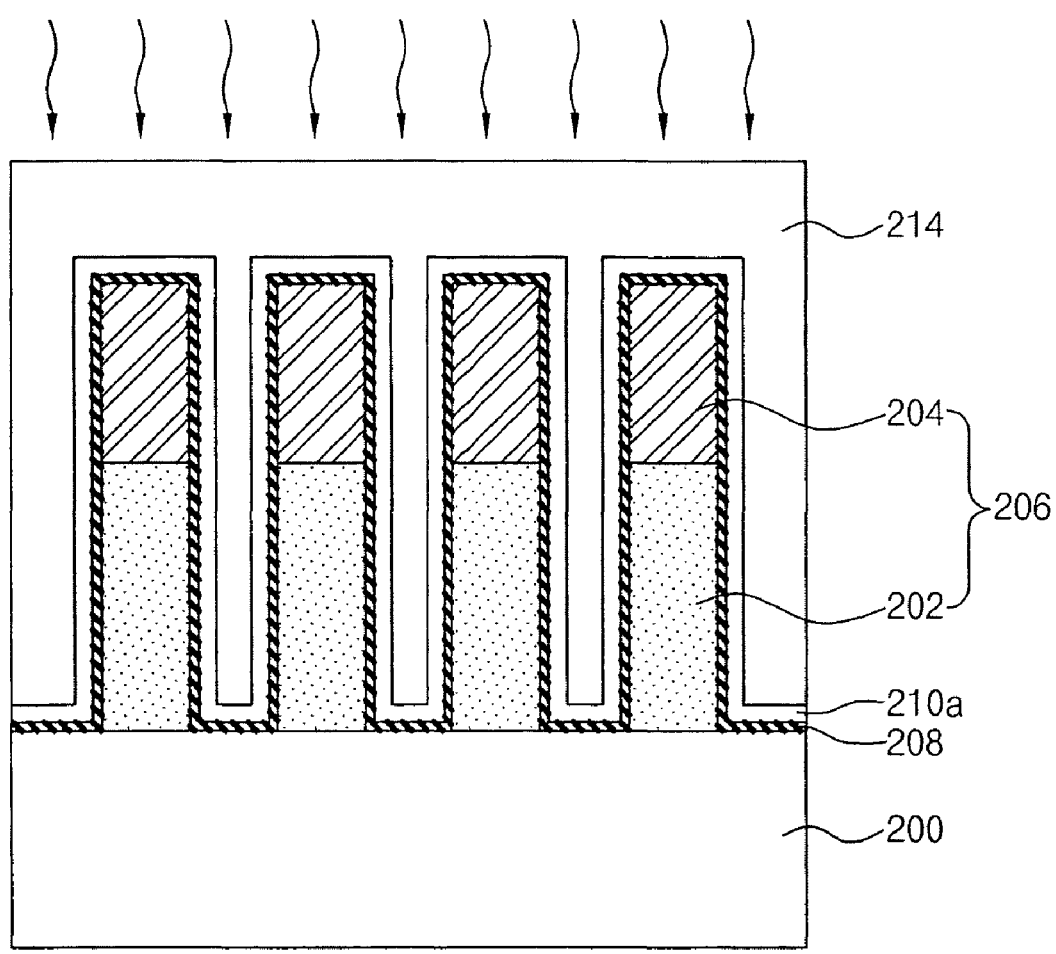

Referring to FIG. 2E, the resultant semiconductor substrate 200, which is formed with the insulation layer 214, is annealed under a wet atmosphere of $H_2O$ and $O_2$ to bake the insulation layer 214 and oxidize the Si-rich oxide layer 210. Through the annealing process, the volume of the insulation layer 214 decreases, whereas the volume of an oxidized Si-rich oxide layer 210a increases.

Here, in the present embodiment, when conducting the annealing process, the thickness of the layer coupled with oxygen and thus oxidized, can be decreased compared to the conventional art due to the fact that the Si-rich oxide layer 210, which is already partially oxidized, is formed on the nitride layer 208 for a spacer. As a result, when the annealing process is performed, the volume decrease of the insulation layer 214 can be sufficiently compensated for because the Si-rich oxide layer 210 is easily oxidized.

In addition, the oxidation process can be conducted quickly at a low temperature because the Si-rich oxide layer 210 has excellent oxygen permeability in comparison with the conventional silicon layer and is easily oxidized. Also, the amount of silicon coupled with oxygen during the annealing process is relatively small since the Si-rich oxide layer 210 is already partially oxidized, and therefore, it is possible to form a layer having a greater thickness than the conventional art, whereby process management can be easily implemented.

Accordingly, in the present embodiment, when conducting the annealing process, the volume decrease of the insulation layer can be compensated for by the oxidation of the Si-rich oxide layer. Accordingly, the change in volume of the insulation layer can be reduced. Therefore, the characteristics and the reliability of the semiconductor device can be improved and the manufacturing yield can be increased since the collapsing of the bit lines and the occurrence of defects due to the change in volume of the insulation layer are minimized.

While the above-described embodiments of the present invention illustrate methods for reducing a change in volume of the insulation layer formed to fill the spaces between bit lines, the present invention can be applied as a method for reducing a change in volume of an insulation layer even in the case of annealing the insulation layer formed to fill trenches in a device isolation process and the insulation layer formed to fill the spaces between gates.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming patterns on a semiconductor substrate having sidewalls and an upper surface;
    forming a spacer layer, an oxidation promotion layer, and a buffer layer in sequence on the semiconductor substrate including surfaces of the patterns;
    forming an insulation layer on the buffer layer to fill the patterns, wherein the insulation layer is formed to directly contact the buffer layer; and
    annealing the semiconductor substrate formed with the insulation layer to oxidize the buffer layer and bake the insulation layer, such that the oxidation of the buffer layer occurs on both surfaces thereof that contact the insulation layer and the oxidation promotion layer, wherein, through the annealing step, the volume of the insulation layer decreases and the volume of an oxidized buffer layer increases, such that the oxidized buffer layer serves to compensate for the decrease in the volume of the insulation layer.

2. The method according to claim 1, wherein the patterns are any ones of trenches, word lines, and bit lines.

3. The method according to claim 1, wherein the spacer layer comprises a nitride layer.

4. The method according to claim 1, wherein the spacer layer is formed to have a thickness in the range of 10~100 Å.

5. The method according to claim 1, wherein the oxidation promotion layer comprises an oxide layer.

6. The method according to claim 1, wherein the oxidation promotion layer is formed to have a thickness in the range of 10~150 Å.

7. The method according to claim 1, wherein the buffer layer comprises an Si layer or a Ge layer.

8. The method according to claim 1, wherein the buffer layer is formed to have a thickness in the range of 10~100 Å.

9. The method according to claim 1, wherein the buffer layer is formed to a smaller thickness on the upper surfaces of the patterns than on the sidewalls of the patterns.

10. The method according to claim 9, wherein, after the buffer layer is deposited, portions of the buffer layer formed on the upper surfaces of the patterns are etched to a smaller thickness on the upper surfaces of the patterns than on the sidewalls of the patterns.

11. The method according to claim 9, wherein the buffer layer is formed to have a thickness 10~100 Å less on the upper surfaces of the patterns than on the sidewalls of the patterns.

12. The method according to claim 1, wherein, after the step of forming the spacer layer, the oxidation promotion layer, and the buffer layer and before the step of forming the insulation layer, the method further comprises the step of:

selectively removing a portion of the buffer layer formed on the upper surfaces of the patterns or completely removing the buffer layer formed on the upper surface of the patterns.

13. The method according to claim 1, wherein the insulation layer comprises a spin-on dielectric (SOD) layer or an $O_3$-USG layer.

14. A method for manufacturing a semiconductor device, comprising the steps of:

forming patterns on a semiconductor substrate;

forming on the semiconductor substrate including surfaces of the patterns, a spacer layer and a buffer layer comprising any one of an Si-rich oxide layer and a Ge-rich oxide layer in sequence;

forming an insulation layer on the buffer layer to fill the patterns, wherein the insulation layer is formed to directly contact the buffer layer; and annealing the semiconductor substrate formed with the insulation layer to oxidize the buffer layer and bake the insulation layer;

wherein, through the annealing step, the volume of the insulation layer decreases and the volume of an oxidized buffer layer increases, such that the oxidized buffer layer serves to compensate for the decrease in the volume of the insulation layer.

15. The method according to claim 14, wherein the patterns are any ones of trenches, word lines, and bit lines.

16. The method according to claim 14, wherein the buffer layer comprises an $SiO_x$ layer ($0.5 \leq x \leq 1.7$) or a $GeO_x$ layer ($0.5 \leq x \leq 1.7$).

17. The method according to claim 14, wherein the buffer layer is formed to have a thickness in the range of 50~200 Å.

18. The method according to claim 14, wherein the insulation layer comprises a spin-on dielectric (SOD) layer or an $O_3$-USG layer.

* * * * *